US012593544B2

(12) United States Patent
Yoon et al.

(10) Patent No.: US 12,593,544 B2
(45) Date of Patent: Mar. 31, 2026

(54) DISPLAY APPARATUS AND MANUFACTURING METHOD THEREFOR, AND MULTI-SCREEN DISPLAY APPARATUS USING SAME

(71) Applicant: LG ELECTRONICS INC., Seoul (KR)

(72) Inventors: Dongjin Yoon, Seoul (KR); Jeongsik Choi, Seoul (KR); Sangtae Park, Seoul (KR); Younhwan Shin, Seoul (KR); Kiseok Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 708 days.

(21) Appl. No.: 17/996,105

(22) PCT Filed: Apr. 13, 2020

(86) PCT No.: PCT/KR2020/004995
§ 371 (c)(1),
(2) Date: Oct. 13, 2022

(87) PCT Pub. No.: WO2021/210697
PCT Pub. Date: Oct. 21, 2021

(65) Prior Publication Data
US 2023/0207750 A1      Jun. 29, 2023

(51) Int. Cl.
*H10H 20/853*      (2025.01)
*H01L 25/075*      (2006.01)
*H10H 20/01*      (2025.01)

(52) U.S. Cl.
CPC ....... *H10H 20/853* (2025.01); *H01L 25/0753* (2013.01); *H10H 20/0362* (2025.01)

(58) Field of Classification Search
CPC ............. H10H 20/0362; H10H 20/854; H10K 59/873; H10K 50/844; H05K 3/288
See application file for complete search history.

(56) References Cited

U.S. PATENT DOCUMENTS

2003/0068953 A1*   4/2003   Yamashita .......... B29C 63/0013
                                                            445/24
2011/0050743 A1*   3/2011   Park ..................... G09G 3/3666
                                                            345/690

(Continued)

FOREIGN PATENT DOCUMENTS

JP         2010-268013      11/2010
JP         2015197969       11/2015

(Continued)

OTHER PUBLICATIONS

Yoon, 2007, English Translation of KR100760931B1 (Year: 2007).*

(Continued)

*Primary Examiner* — Kretelia Graham
*Assistant Examiner* — Hamna Fathima Iqbal
(74) *Attorney, Agent, or Firm* — LEE, HONG, DEGERMAN, KANG & WAIMEY

(57) ABSTRACT

Display device according to an embodiment of the present invention includes a substrate, a plurality of semiconductor light emitting devices formed on the upper surface of the substrate, and a coating layer formed on the substrate. The coating layer includes an encapsulation layer formed at a predetermined height from the upper surface of the substrate and covering the plurality of semiconductor light emitting devices, and a film layer formed on the upper surface of the encapsulation layer. A polishing pattern is formed on the upper surface of the encapsulation layer.

6 Claims, 9 Drawing Sheets

(56) References Cited

U.S. PATENT DOCUMENTS

| | | | | |
|---|---|---|---|---|
| 2011/0051037 A1* | 3/2011 | Kim | ................. | G02F 1/133603 |
| | | | | 362/235 |
| 2011/0223839 A1* | 9/2011 | Jung | ..................... | B24B 9/065 |
| | | | | 349/158 |
| 2015/0015974 A1* | 1/2015 | Jeong | ................... | G02B 27/02 |
| | | | | 359/811 |
| 2015/0340655 A1 | 11/2015 | Lee et al. | | |
| 2016/0190105 A1 | 6/2016 | Rhee et al. | | |
| 2017/0047548 A1 | 2/2017 | Mieda et al. | | |
| 2021/0223629 A1* | 7/2021 | Tsuzuki | ................... | C09J 7/381 |
| 2022/0119683 A1* | 4/2022 | Wu | ........................... | C09J 5/06 |

FOREIGN PATENT DOCUMENTS

| | | | | |
|---|---|---|---|---|
| KR | 100760931 B1 * | 9/2007 | .......... | G02F 1/1335 |
| KR | 2012-0028715 | 3/2012 | | |
| KR | 1020140073210 | 6/2014 | | |
| KR | 1020140085087 | 7/2014 | | |
| KR | 2018-0029845 | 3/2018 | | |
| KR | 2020-0026769 | 3/2020 | | |
| WO | 2018-170352 | 9/2018 | | |

OTHER PUBLICATIONS

Korean Intellectual Property Office Application No. 10-2022-7038627, Notice of Allowance dated Nov. 11, 2024, 8 pages.
PCT International Application No. PCT/KR2020/004995, International Search Report dated Jan. 11, 2021, 5 pages.
Korean Intellectual Property Office Application No. 10-2022-7038627 Office Action dated Mar. 8, 2024, 6 pages.

* cited by examiner

[FIG. 1]
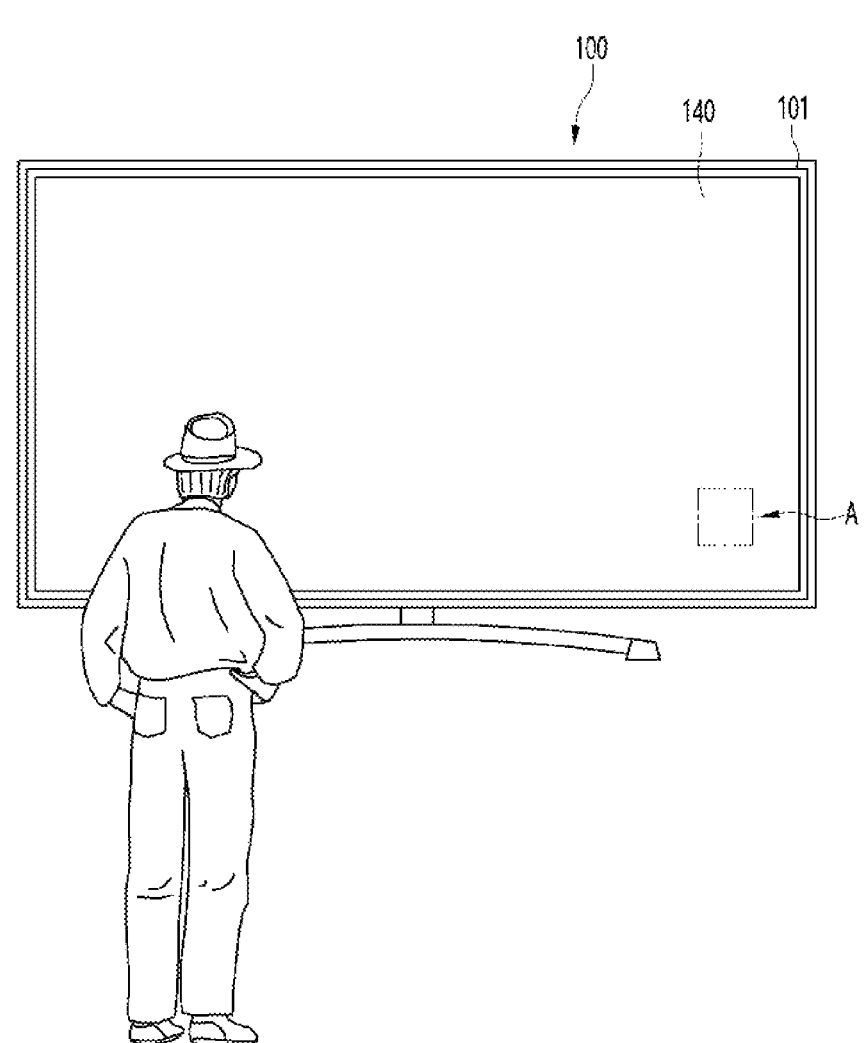

[FIG. 2]
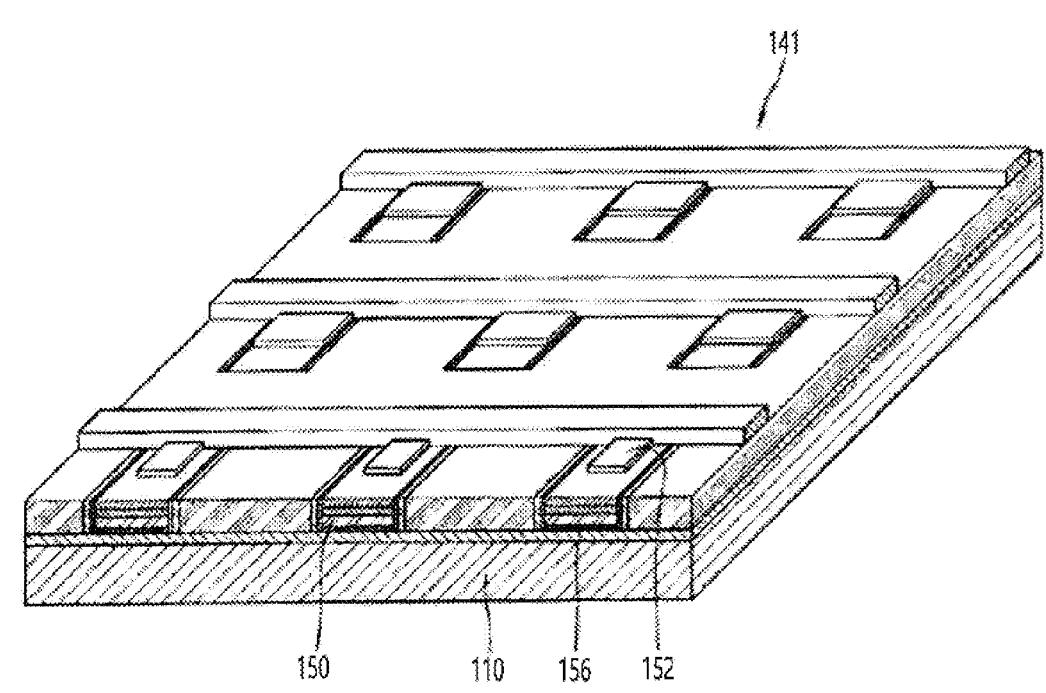
[FIG. 3]
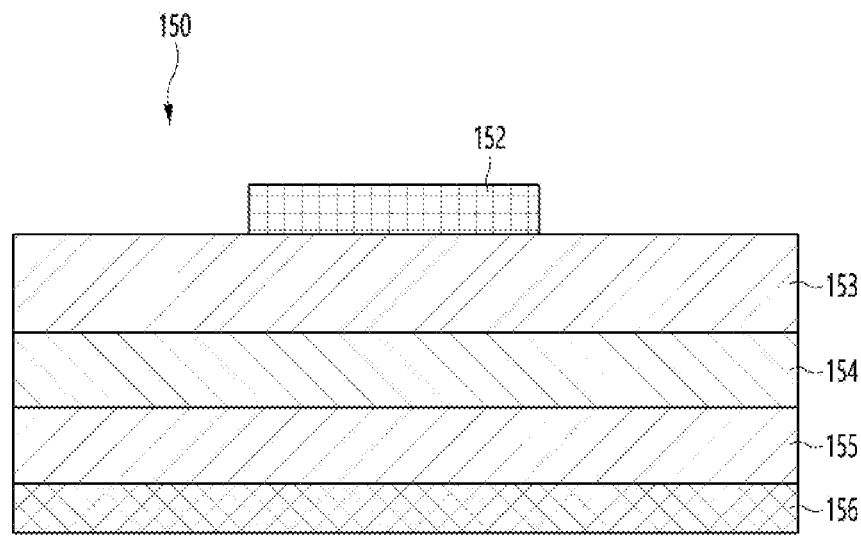

[FIG. 4]
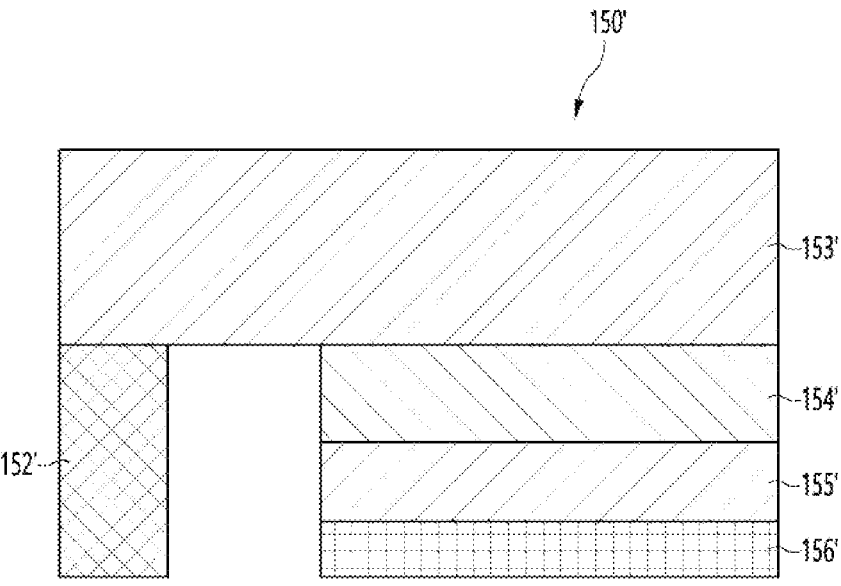
[FIG. 5A]
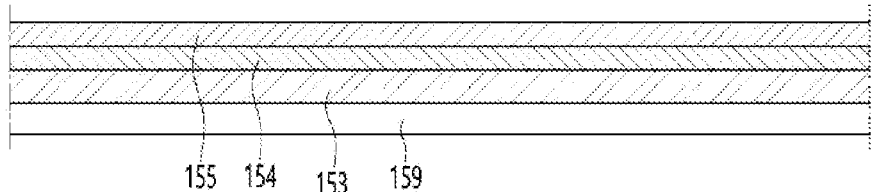
[FIG. 5B]
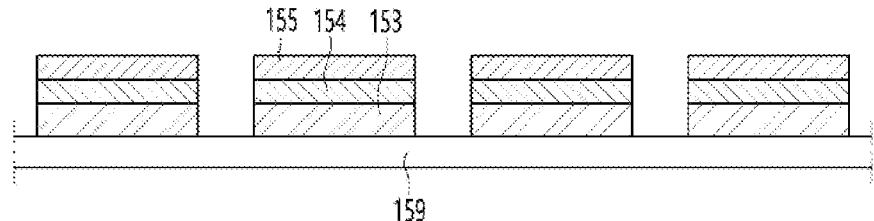
[FIG. 5C]
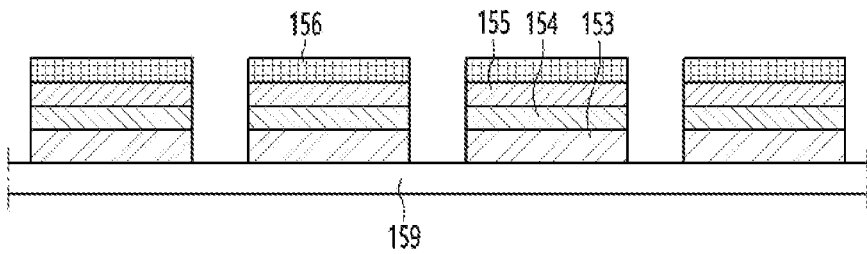

[FIG. 5D]
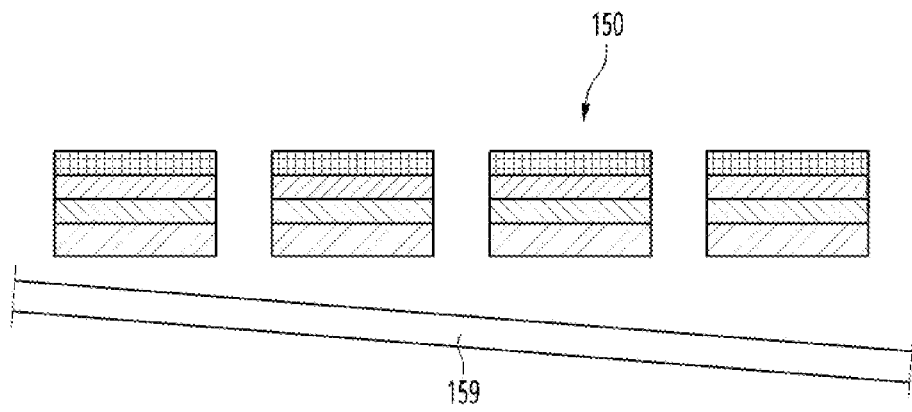
[FIG. 6]
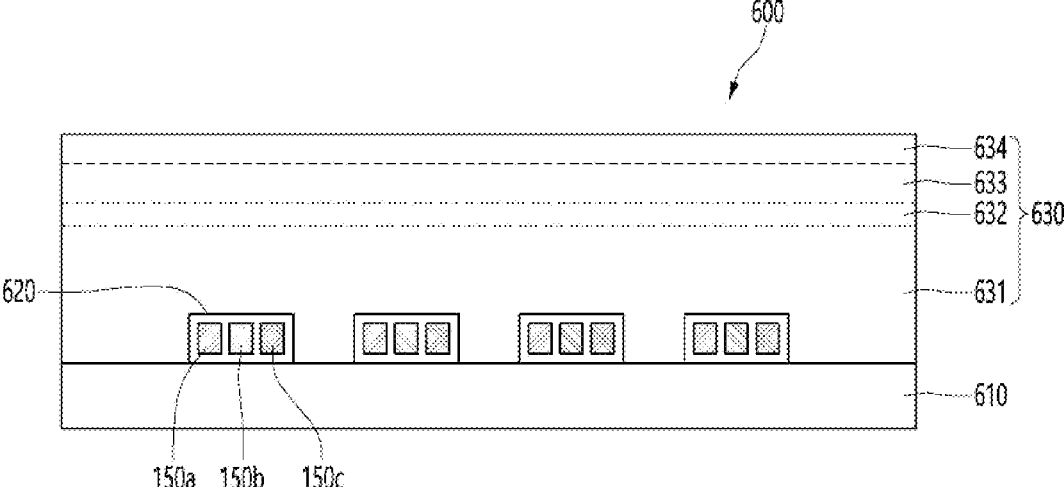

[FIG. 7]
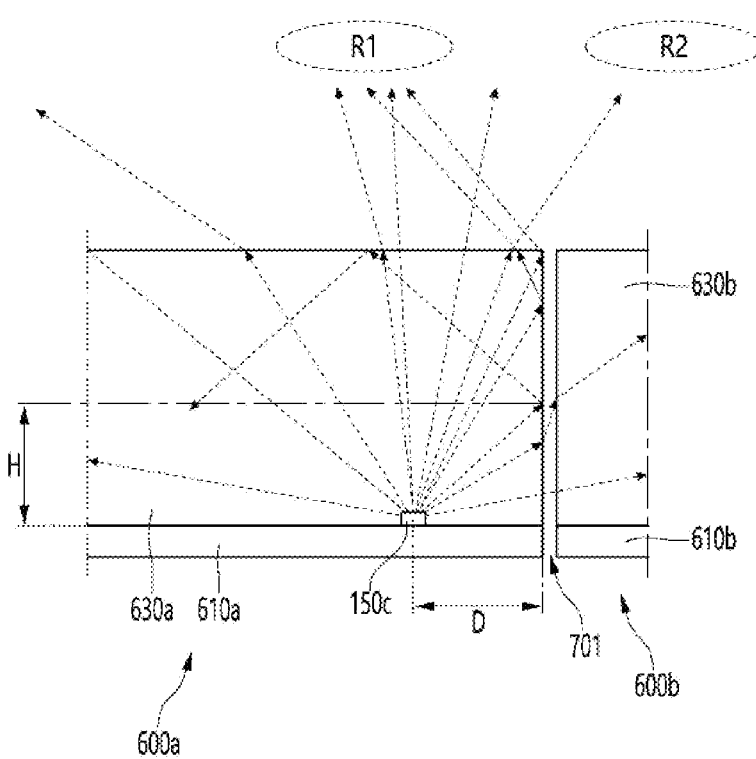
[FIG. 8]
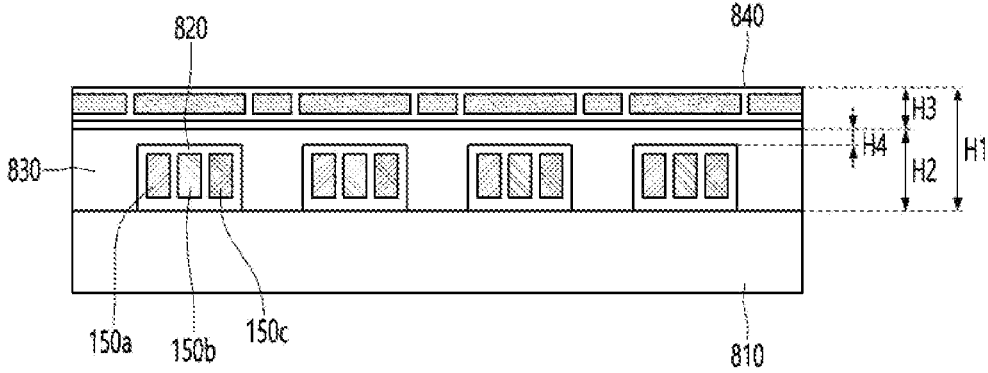

[FIG. 9A]
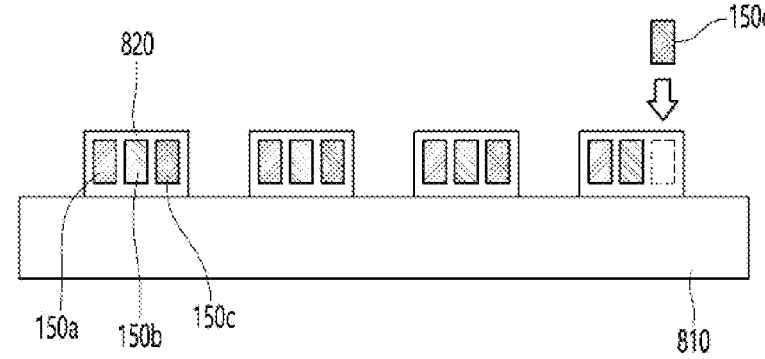
[FIG. 9B]
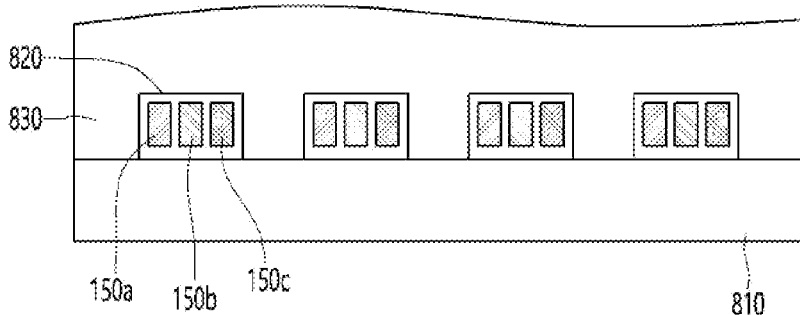
[FIG. 9C]
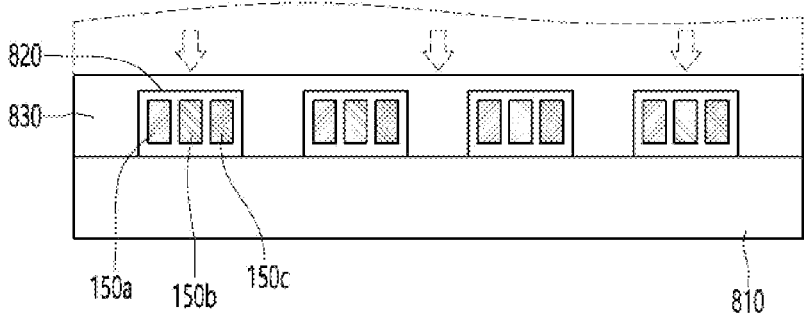

[FIG. 9D]
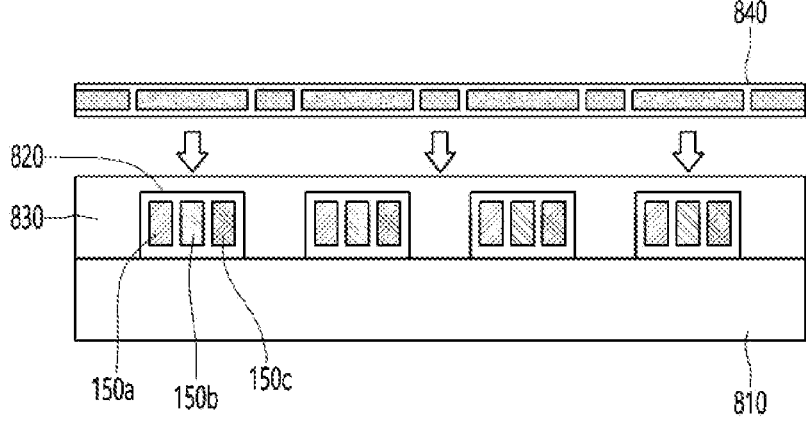
[FIG. 10A]
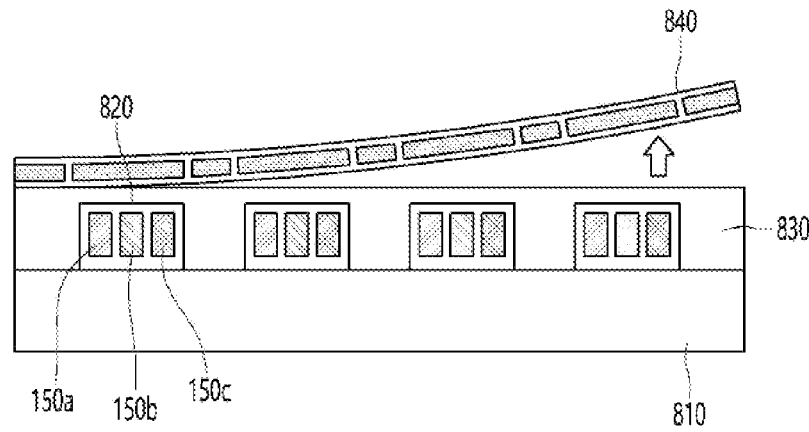
[FIG. 10B]
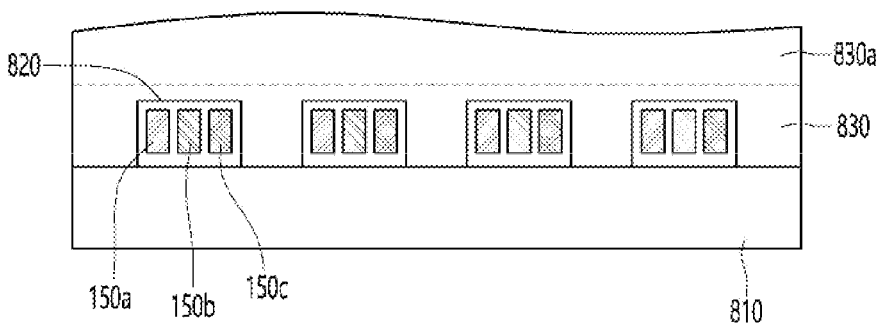

[FIG. 10C]
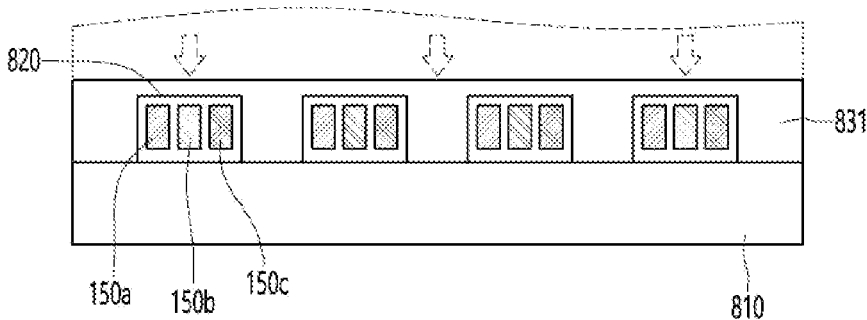
[FIG. 10D]
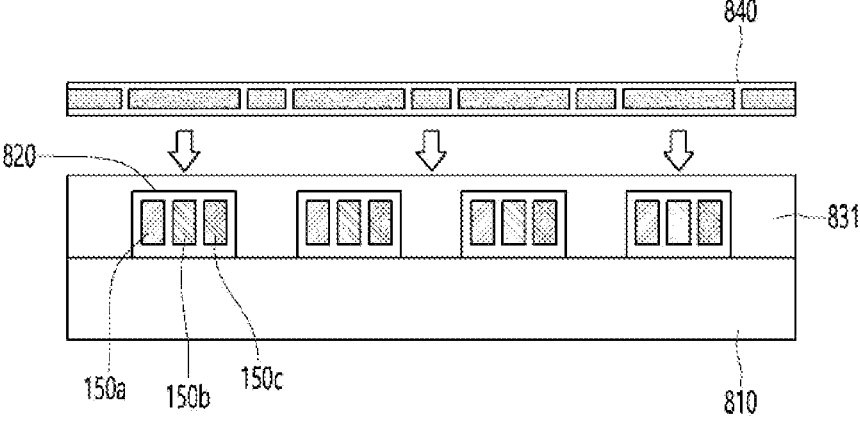
[FIG. 11]
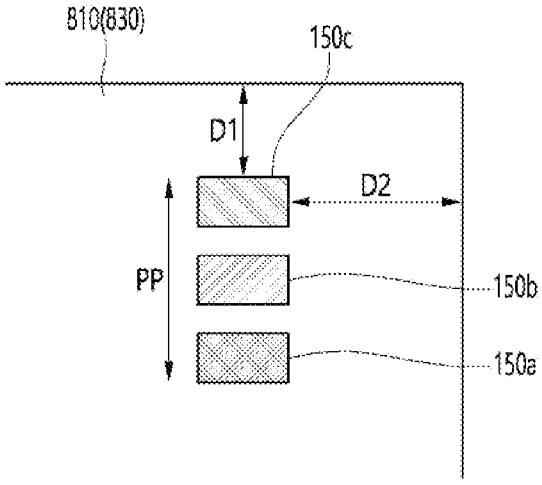

[FIG. 12]

DISPLAY APPARATUS AND MANUFACTURING METHOD THEREFOR, AND MULTI-SCREEN DISPLAY APPARATUS USING SAME

CROSS-REFERENCE TO RELATED APPLICATIONS

This application is the National Stage filing under 35 U.S.C. 371 of International Application No. PCT/KR2020/004995, filed on Apr. 13, 2020, the contents of which is hereby incorporated by reference herein in its entirety.

TECHNICAL FIELD

The present invention relates to a display device, a manufacturing method thereof, and a multi-screen display device using the same.

BACKGROUND ART

Recently, in the field of display technology, display devices having excellent characteristics such as thinness and flexibility have been developed. On the other hand, currently commercialized main displays are represented by LCD (Liquid Crystal Display) and AMOLED (Active Matrix Organic Light Emitting Diodes).

However, in the case of LCD, there are problems in that the response time is not fast and it is difficult to implement flexible, and in the case of AMOLED, there are weaknesses in that the life is short and the mass production yield is not good.

On the other hand, a light emitting diode (Light Emitting Diode: LED) is a well-known semiconductor light emitting device that converts electric current into light, the light emitting diodes have been used as light sources for display images of electronic devices including information and communication devices, along with GaP:N-based green LEDs, starting with the commercialization of red LEDs using GaAsP compound semiconductors in 1962. Accordingly, a method for solving the above problems by implementing a display using the semiconductor light emitting device can be proposed. Such a light emitting diode has various advantages, such as a long life, low power consumption, excellent initial driving characteristics, and high vibration resistance, compared to a filament-based light emitting device.

In particular, recently, research and development on a display device using a semiconductor light emitting device having a diameter or cross-sectional area of about 100 micrometers or less has been conducted, and since such a display device has high image quality and high reliability, it is in the spotlight as a next-generation display.

However, the conventional display device using a semiconductor light emitting device is manufactured by transferring the semiconductor light emitting device to a substrate such as a TFT substrate or a wiring substrate, there is a problem in that productivity is lowered due to a transfer defect rate of the semiconductor light emitting device, and in particular, a production yield of a large-area display device is extremely low. In order to solve this problem, recently, research and development of a multi-screen display device that implements a large display device by connecting a plurality of semiconductor light emitting device display devices having a relatively small size has been conducted.

Meanwhile, each of the unit display devices may be implemented with a material such as silicon or epoxy on the semiconductor light emitting device and the substrate, and a coating layer protecting the semiconductor light emitting device and the substrate may be formed. In a conventional case, the coating layer may be formed according to a molding or hot melt process.

However, in the case of the above process, there is a problem in that it is difficult to reduce the thickness of the coating layer to less than a predetermined thickness. Also, when the coating layer is not normally formed, it is virtually impossible to re-form the coating layer.

When the thickness of the coating layer is thick, total reflection may occur in the edge area of each unit display device. Due to the total reflection phenomenon, light of a specific color is extinguished or amplified in an area between unit display devices included in the multi-screen display device, and as a result, light having a different characteristic from that of the surrounding area is output. This gives a sense of disconnection and heterogeneity when one image is displayed on the entire area of the multi-screen display device, thereby reducing immersion in the image.

DISCLOSURE

Technical Problem

A problem to be solved by the present invention is to provide a display device including a semiconductor light emitting device having a slimmer size by reducing the thickness of the coating layer.

Another problem to be solved by the present invention is to prevent a phenomenon in which light having a characteristic different from that of a peripheral area is output in a boundary area of the display devices when an image is output through a multi-screen display device.

Technical Solution

Display device according to an embodiment of the present invention includes a substrate, a plurality of semiconductor light emitting devices formed on the upper surface of the substrate, and a coating layer formed on the substrate. The coating layer includes an encapsulation layer formed at a predetermined height from the upper surface of the substrate and covering the plurality of semiconductor light emitting devices, and a film layer formed on the upper surface of the encapsulation layer. A polishing pattern can be formed on the upper surface of the encapsulation layer.

According to an embodiment, the height from the upper surface of the substrate to the upper surface of the coating layer may have a height to avoid total reflection of light irradiated to the side surface of the coating layer from the semiconductor light emitting device closest to the edge area of the substrate among the plurality of semiconductor light emitting devices.

In some embodiments, the height from the top of the plurality of semiconductor light emitting devices to the upper surface of the encapsulation layer can be less than or equal to the height from the upper surface of the encapsulation layer to the upper surface of the film layer.

According to an embodiment, the height from the upper surface of the substrate to the upper surface of the encapsulation layer can be greater than or equal to the height from the upper surface of the encapsulation layer to the upper surface of the film layer.

The encapsulation layer can be formed by coating a light-transmitting encapsulant made of silicone or epoxy on the substrate.

The multi-screen display device according to an embodiment of the present invention can be implemented by tiled the plurality of display devices.

Method for manufacturing a display device according to an embodiment of the present invention includes transferring a plurality of semiconductor light emitting devices to the upper surface of the substrate, forming an encapsulation layer covering the upper surface of the substrate and the plurality of semiconductor light emitting devices, removing the encapsulation layer exceeding a preset height from the upper surface of the substrate, among the encapsulation layers and forming a film layer on the upper surface of the encapsulation layer.

According to an embodiment, removing the encapsulation layer exceeding the preset height includes performing a lapping process on the encapsulation layer exceeding the preset height. A polishing pattern according to the lapping process may be formed on the upper surface of the encapsulation layer.

According to an embodiment, a method of manufacturing the display device can further include removing the film layer, applying a light-transmitting encapsulant on the encapsulation layer, forming a reworked encapsulation layer by removing an encapsulation layer or a light-transmitting encapsulant exceeding a preset height from the upper surface of the substrate from among the encapsulation layer and the applied light-transmitting encapsulant and forming a film layer on the upper surface of the reworked encapsulation layer.

Advantageous Effects

According to an embodiment of the present invention, the display device can form the encapsulation layer in advance by applying a light-transmitting encapsulant on the substrate, unlike a conventional process such as molding when the coating layer is formed. Accordingly, the present invention can reduce the overall height of the coating layer by reducing the height of the encapsulation layer according to the lapping process before the formation of the film layer included in the coating layer. As the height of the coating layer is reduced, the phenomenon of total reflection in the edge area of the display device can be minimized or eliminated, so the output of light having a characteristic different from that of the peripheral area in the edge area can be minimized.

Accordingly, when one image is provided in a multi-screen display device including a plurality of tiled display devices, it is possible to prevent the occurrence of heterogeneity or quality deterioration of the image due to the difference in optical characteristics in the edge area.

Also, when the encapsulation layer is not normally formed during the manufacture of the display device, rework can be performed on the encapsulation layer after removing the film layer. Accordingly, when defects in the encapsulation layer occur, defects of the display device can be solved through rework without discarding the display device, so the manufacturing yield is maximized, thereby reducing the manufacturing cost and time.

DESCRIPTION OF DRAWINGS

FIG. 1 is a conceptual diagram illustrating a display device including a semiconductor light emitting device as an embodiment of a display device of the present invention.

FIG. 2 is an enlarged view of portion A of the display device of FIG. 1.

FIG. 3 is an enlarged view of the semiconductor light emitting device of FIG. 2.

FIG. 4 is an enlarged view showing another embodiment of the semiconductor light emitting device of FIG. 2.

FIGS. 5A to 5D are conceptual views for explaining an example of a manufacturing process of the above-described semiconductor light emitting device.

FIG. 6 is a cross-sectional view schematically illustrating the structure of a conventional display device.

FIG. 7 is an exemplary view for explaining a total reflection phenomenon occurring in an edge area of a conventional display device.

FIG. 8 is a cross-sectional view schematically showing the structure of a display device according to an embodiment of the present invention.

FIGS. 9A to 9D are diagrams for explaining an embodiment of a manufacturing process of the display device shown in FIG. 8.

FIGS. 10A to 10D are views for explaining an embodiment of a process of re-forming a coating layer of the display device shown in FIG. 8.

FIG. 11 is an exemplary view for explaining the relationship between the distance between the semiconductor light emitting device and the edge area of the display device and the thickness of the coating layer.

FIG. 12 is an exemplary diagram illustrating a state in which light is output from an edge area of the display device according to the embodiment of FIG. 8.

MODE FOR INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies may obscure the gist of the embodiments disclosed in the present specification, the detailed description thereof will be omitted. Also, the attached drawings are only for easy understanding of the embodiments disclosed in the present specification, and should not be construed as limiting the technical idea disclosed herein by the attached drawings.

Also, when an element such as a layer, area or substrate is referred to as being "on" another component, it will be understood that this can be directly on other elements or intervening elements may exist in between.

A display device described in this specification can include a mobile phone, a smart phone, a laptop computer, a digital broadcasting terminal, a personal digital assistant (PDA), a portable multimedia player (PMP), a navigation system, a slate PC, a Tablet PC, an Ultra Book, a digital TV, a digital signage, a head mounted display (HMD), a desktop computer, and the like. However, it will be readily apparent to those skilled in the art that the configuration according to the embodiment described herein can be applied to a display capable device even in a new product form to be developed later.

FIG. 1 is a conceptual diagram illustrating an embodiment of a display device using a semiconductor light emitting device of the present invention, and FIG. 2 is an enlarged view of portion A of the display device of FIG. 1. FIG. 3 is an enlarged view of the semiconductor light emitting device of FIG. 2, and FIG. 4 is an enlarged view illustrating another embodiment of the semiconductor light emitting device of FIG. 2.

According to the city, information processed by the control unit of the display device 100 can be output through the display module 140. A closed-loop case 101 surrounding the edge of the display module 140 can form a bezel of the display device 100.

The display module 140 can include a panel 141 on which an image is displayed, and the panel 141 can include a semiconductor light emitting device 150 and a wiring substrate 110 on which the semiconductor light emitting device 150 is mounted. The semiconductor light emitting device 150 can include a mini LED having a diameter or cross-sectional area of about 100 micrometers or a micro-LED having a size smaller than that.

A wiring is formed on the wiring substrate 110 to be connected to the n-type electrode 152 and the p-type electrode 156 of the semiconductor light emitting device 150. Through this, the semiconductor light emitting device 150 can be provided on the wiring substrate 110 as individual pixels that emit light.

The image displayed on the panel 141 is visual information, and is implemented by independently controlling the light emission of sub-pixels arranged in a matrix form through the wiring.

In the present invention, a micro-LED (Light Emitting Diode) (or mini LED) is exemplified as a type of the semiconductor light emitting device 150 that converts electric current into light. The micro-LED can be a light emitting diode formed in a small size of 100 micro or less. In the semiconductor light emitting device 150, blue, red, and green colors are respectively provided in the light emitting area, and a unit pixel can be implemented by a combination thereof. That is, the unit pixel means a minimum unit for implement one color, and at least three micro-LEDs can be provided in the unit pixel.

More specifically, referring to FIG. 3, the semiconductor light emitting device 150 can have a vertical structure.

For example, the semiconductor light emitting device 150 can be implemented as a high output light emitting device that emits various types of light, including blue, by using gallium nitride (GaN) as a main component and adding indium (In) and/or aluminum (Al) together.

Such a vertical semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 can be electrically connected to the p-electrode of the wiring substrate, and the upper n-type electrode 152 can be electrically connected to the n-electrode at the upper side of the semiconductor light emitting device. The vertical semiconductor light emitting device 150 has a great advantage in that the size of a chip can be reduced because electrodes can be arranged up and down.

As another example, referring to FIG. 4, the semiconductor light emitting device can be a flip chip type light emitting device.

As an example, the semiconductor light emitting device 150' includes a p-type electrode 156', a p-type semiconductor layer 155' on which the p-type electrode 156' is formed, the active layer 154' formed on the p-type semiconductor layer 155', the n-type semiconductor layer 153' formed on the active layer 154', and an n-type electrode 152' formed under the n-type semiconductor layer 153' and spaced apart from the p-type electrode 156' in the horizontal direction. In this case, both the p-type electrode 156' and the n-type electrode 152' can be electrically connected to the p-electrode and the n-electrode of the wiring substrate under the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. In the case of the green semiconductor light emitting device and the blue semiconductor light emitting device, Gallium nitride (GaN) can be mainly used, and indium (In) and/or aluminum (Al) can be added together, high-output light emitting devices emitting green light or blue light can be implemented. For this example, the semiconductor light emitting device can be a gallium nitride thin film formed in various layers such as n-Gan, p-Gan, AlGaN, InGan, etc. Specifically, the p-type semiconductor layer can be P-type GaN, and the n-type semiconductor layer can be N-type GaN. However, in the case of a red semiconductor light emitting device, the p-type semiconductor layer can be P-type GaAs, and the n-type semiconductor layer can be N-type GaAs.

Also, the p-type semiconductor layer can be P-type GaN doped with Mg on the p-electrode side, and the n-type semiconductor layer can be N-type GaN doped with Si on the n-electrode side. In this case, the above-described semiconductor light emitting devices can be semiconductor light emitting devices without an active layer.

Meanwhile, referring to FIGS. 1 to 4, since the light emitting diode is very small, unit pixels that emit self-luminescence can be arranged in a high definition in the display panel, thereby implementing a high-definition display device.

In the display device using the semiconductor light emitting device of the present invention described above, the semiconductor light emitting device grown on a wafer and formed through mesa and isolation is used as an individual pixel. In this case, the micro-sized semiconductor light emitting device 150 can be transferred from the wafer to a preset position on the substrate of the display panel. As such a transfer technology, there are technologies such as pick and place, stamp transfer, roll transfer, fluidic assembly, and laser transfer.

FIGS. 5A to 5D are conceptual views for explaining an example of a manufacturing process of the above-described semiconductor light emitting device.

In this specification, a display device using a passive matrix (PM) type semiconductor light emitting device is exemplified. However, the examples described below are also applicable to an active matrix (AM) type semiconductor light emitting device.

First, according to the manufacturing method, the first conductivity type semiconductor layer 153, the active layer 154, and the second conductivity type semiconductor layer 155 can be grown on the growth substrate 159, respectively (FIG. 5A).

When the first conductivity type semiconductor layer 153 is grown, next, an active layer 154 is grown on the first conductivity type semiconductor layer 153, next, a second conductivity type semiconductor layer 155 is grown on the active layer 154. In this way, when the first conductivity type semiconductor layer 153, the active layer 154, and the second conductivity type semiconductor layer 155 can be sequentially grown, as shown in FIG. 5A, the first conductivity type semiconductor layer 153, the active layer 154, and the second conductivity type semiconductor layer 155 can form a stacked structure.

In this case, the first conductivity type semiconductor layer 153 can be a p-type semiconductor layer, and the second conductivity type semiconductor layer 155 can be an n-type semiconductor layer. However, the present invention is not necessarily limited thereto, and examples in which the first conductivity type is n-type and the second conductivity type is p-type are also possible.

Also, although the present embodiment exemplifies the case in which the active layer is present, a structure in which the active layer is not present is also possible in some cases as described above. For this example, the p-type semiconductor layer can be P-type GaN doped with Mg, and the n-type semiconductor layer can be N-type GaN doped with Si on the n-electrode side.

The growth substrate 159 (wafer) can be formed of a material having a light-transmitting property, for example, any one of sapphire ($Al_2O_3$), GaN, ZnO, and AlO, but is not limited thereto. Also, the growth substrate 1059 can be formed of a material suitable for semiconductor material growth, a carrier wafer. It can be formed of a material having excellent thermal conductivity, including a conductive substrate or an insulating substrate. For example, at least one of Si, GaAs, GaP, InP, and $Ga_2O_3$ or a SiC substrate having higher thermal conductivity than a sapphire ($Al_2O_3$) substrate can be used.

Next, at least some portions of the first conductivity type semiconductor layer 153, the active layer 154, and the second conductivity type semiconductor layer 155 are removed to form a plurality of semiconductor light emitting devices (refer to FIG. 5B).

More specifically, an isolation can be performed so that a plurality of light emitting devices form a light emitting device array. That is, the first conductivity type semiconductor layer 153, the active layer 154, and the second conductivity type semiconductor layer 155 can be vertically etched to form a plurality of semiconductor light emitting devices.

If a horizontal type semiconductor light emitting device is formed, the active layer 154 and the second conductivity type semiconductor layer 155 are partially removed in the vertical direction, so the first conductivity type semiconductor layer 153 is exposed to the outside in a mesa process, thereafter, isolation of forming a plurality of semiconductor light emitting device arrays by etching the first conductivity type semiconductor layer can be performed.

Next, second conductive electrodes 156 (or p-type electrodes) are respectively formed on one surface of the second conductivity type semiconductor layer 155 (refer to FIG. 5C). The second conductive electrode 156 can be formed by a deposition method such as sputtering, but the present invention is not limited thereto. However, when the first conductivity type semiconductor layer and the second conductivity type semiconductor layer are an n-type semiconductor layer and a p-type semiconductor layer respectively, the second conductive electrode 156 can be an n-type electrode.

Next, the growth substrate 159 can be removed to provide a plurality of semiconductor light emitting devices. For example, the growth substrate 1059 can be removed using a laser lift-off (LLO) method or a chemical lift-off (CLO) method (refer to FIG. 5D). The plurality of semiconductor light emitting devices separated as the growth substrate 159 is removed can be transferred to the substrate according to the above-described transfer technique.

FIG. 6 is a cross-sectional view schematically showing the structure of a conventional display device. FIG. 7 is an exemplary view for explaining a total reflection phenomenon occurring in an edge area of a conventional display device.

Referring to FIG. 6, the display device 600 can include a substrate 610, a plurality of semiconductor light emitting device assemblies 620 formed on the substrate 610, a buffer layer 630 formed on the substrate 610 to cover an upper surface of the substrate 610 and the plurality of semiconductor light emitting device assemblies 620.

The substrate 610 can be made of a material such as glass or plastic. For example, the substrate 610 can be implemented as a TFT (Thin Film Transistor) substrate, and in this case, a thin film transistor and various wirings for driving semiconductor light emitting devices can be formed on the substrate 610.

A plurality of pixel areas can be formed on the substrate 610, and a semiconductor light emitting device assemblies 620 can be formed in each of the pixel areas.

For example, each of the semiconductor light emitting device assemblies 620 may include three semiconductor light emitting devices 150a to 150c each emitting monochromatic light of R (red), G (green), and B (blue). Each of the semiconductor light emitting devices 150a to 150c can be implemented as an LED (micro-LED, mini LED, etc.) having a size of about 100 micrometers or less.

Each of the semiconductor light emitting devices 150a to 150c can be separately fabricated on a wafer and then transferred onto the substrate 610. For example, each of the semiconductor light emitting devices 150a to 150c can be transferred onto the substrate 610 by various transfer techniques such as pick and place, stamp transfer, roll transfer, fluidic assembly, electromagnetic field, laser transfer and the like. As each of the semiconductor light emitting devices 150a to 150c is transferred onto the substrate 610, the semiconductor light emitting device assemblies 620 can be formed.

Meanwhile, after the semiconductor light emitting device assemblies 620 is formed, a coating layer 630 can be formed on the substrate 610.

For example, the coating layer 630 may include an encapsulation layer 631, and at least one film layer 632 to 634 formed on the encapsulation layer 631.

The encapsulation layer 631 can be formed to have a predetermined height upward from the substrate 610. In particular, the encapsulation layer 631 can be formed to have a height higher than that of the semiconductor light emitting devices 150a to 150c. That is, the encapsulation layer 631 covers the upper surface of the substrate 610 and the semiconductor light emitting devices 150a to 150c to shield from the outside, thereby protecting the semiconductor light emitting devices 150a to 150c and the wirings on the upper surface of the substrate 610.

For example, the encapsulation layer 631 can be implemented with a light-transmitting material such as silicone or epoxy.

The at least one film layer 632 to 634 can be formed on the encapsulation layer 631. For example, the at least one film layer 632 to 634 may include an optical clear adhesive (OCA) 632, a polarizing film 633, and an anti-reflection film 634 or an anti-glare film.

The coating layer 630 can be formed by a process such as molding or hot melt. However, according to the above process, it may be difficult to reduce the thickness of the coating layer 630 to less than a predetermined thickness because there is a limit in the thickness of the coating layer 630 according to the formation of the mold, and it is necessary to consider the height deviation for each part due to the bending of the substrate 610, etc. In particular, after the coating layer 630 is formed by the above process, it may not be possible to remove the film layers 632 to 634 from the encapsulation layer 631. Accordingly, after the coating layer 630 is formed, it may be difficult to reduce the thickness of the encapsulation layer 631 or to rework the encapsulation layer 631 in which a defect occurs.

Referring to FIG. 7, among the tiled display devices, the semiconductor light emitting device 150c disposed on the first substrate 610a of the first display device can be disposed closest to the edge of the first display device.

In this case, some of the light emitted from the semiconductor light emitting device 150c can be irradiated to the side surface of the coating layer 630a. Among the light irradiated to the side of the coating layer 630a, the light irradiated to a position less than a predetermined height H may pass through the coating layer 630a and be irradiated to the gap area 701 and the coating layer 630b of the second display device 600b. On the other hand, among the light irradiated to the side surface of the coating layer 630a, the light irradiated to a position higher than a predetermined height H can be totally reflected from the side surface of the coating layer 630a.

As is known, the angle at which total reflection occurs can be calculated by Snell's law. The height H of the point where the total reflection occurs can be estimated by the distance D between the semiconductor light emitting device 150c and the side surface (edge of the display device) of the coating layer 630a and the calculated total reflection occurrence angle.

For example, when the distance D between the semiconductor light emitting device 150c and the side surface of the coating layer 630a is about 140 µm the coating layer 630a should be formed to be less than about 125 µm in order to prevent total reflection from occurring. However, in the case of conventional molding or hot melt processes, it may be difficult to reduce the height of the coating layer 630 because there is a limit to the height of the coating layer 630 according to the formation of the mold, and it is necessary to consider the height deviation for each part due to the bending of the substrate 610.

That is, in the conventional case, since it is impossible to reduce the thickness of the coating layer 630 to a thickness in which total reflection does not occur, some of the light emitted from the semiconductor light emitting device 150 disposed in the edge area of the display device 600 may be totally reflected from the side surface of the coating layer 630. Since the characteristics (color, brightness, etc.) of light emitted from the edge area are different from those of the surrounding area by the total reflected light, the quality of an image displayed to the user may be deteriorated. For example, in the first area R1, the amount of light provided from the semiconductor light emitting device 150c may increase (increased light) due to the total reflection described above, in the second area R2, the amount of light provided from the semiconductor light emitting device 150c may decrease (decreased light) due to the total reflection.

In particular, when a multi-screen display device in which a plurality of display devices 600 are tiled displays one image, since a difference in optical characteristics between the boundary portion between the display device 600 and other areas is more easily observed, the user may feel a sense of heterogeneity or discomfort when viewing an image.

According to an embodiment of the present invention, by effectively reducing the thickness of the coating layer of the display device 600, it is possible to prevent deterioration of the quality of the edge area of the display device 600 due to the total reflection phenomenon described above.

Figure 12:
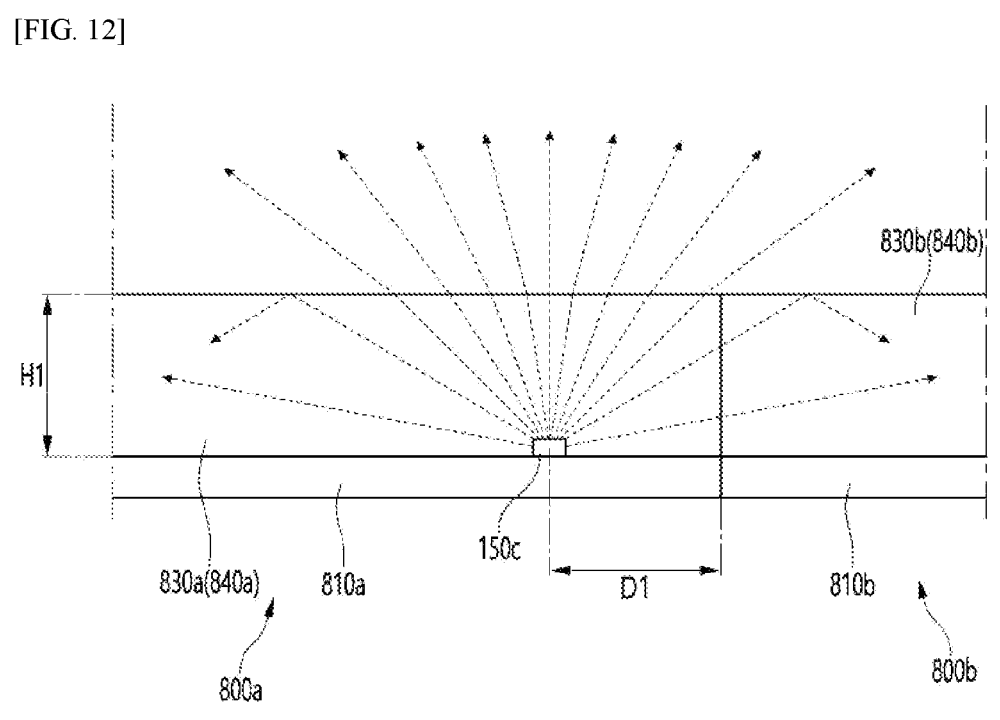

Hereinafter, a display device according to an embodiment of the present invention and a multi-screen display device using the same will be described in detail with reference to FIGS. 8 to 12.

FIG. 8 is a cross-sectional view schematically illustrating the structure of a display device according to an embodiment of the present invention.

Referring to FIG. 8, the display device 800 can include a substrate 810, a plurality of semiconductor light emitting device assemblies 820 each including a plurality of semiconductor light emitting devices 150a to 150c, an encapsulation layer 830, and a film layer 840. The encapsulation layer 830 and the film layer 840 may correspond to a coating layer.

The substrate 810 and the plurality of semiconductor light emitting device assemblies 820 are substantially the same as the substrate 610 and the plurality of semiconductor light emitting device assemblies 620 shown in FIG. 6, a description thereof will be omitted.

On the other hand, the encapsulation layer 830 of the display device 800 according to an embodiment of the present invention can be formed to have a lower height H2 than the encapsulation layer 631 of the conventional display device 600.

Specifically, the encapsulation layer 830 can be formed by removing the encapsulant formed at a height greater than or equal to the height H2 through a lapping process on the surface of the encapsulation layer 830, after applying a light-transmitting encapsulant such as silicone or epoxy to a predetermined height on the substrate 810. Since the height H2 of the encapsulation layer 830 from the substrate 810 is decreased, the height H4 of the encapsulation layer 830 from the upper surfaces of the semiconductor light emitting devices 150a to 150c can also decrease.

The film layer 840 can be attached to an upper portion of the encapsulation layer 830 on which the lapping process is performed. For example, the film layer 840 may include a low-reflective film (eg, a black coating film, etc.) having a lower transmittance than a polarizing film and an OCA formed under the low-reflective film, but is not limited thereto. According to the present invention, unlike the conventional molding process, the height H3 of the film layer 840 can also be minimized, so the overall height H1 (or thickness) of the upper portion of the substrate 810 can be reduced.

On the other hand, since the encapsulation layer 830 is formed to cover the semiconductor light emitting devices 150a to 150c, the height H2 of the encapsulation layer 830 from the substrate 810 can be higher than the height of the semiconductor light emitting device 150a to 150c or the semiconductor light emitting device assemblies 820, and can be higher than the height H3 of the film layer 840 from the upper surface of the encapsulation layer 830.

Meanwhile, in order to implement a slim display device 800 by minimizing the height H1 of the coating layers 830 and 840 formed on the substrate 810, a height H4 of the encapsulation layer 830 from the upper surfaces of the semiconductor light emitting devices 150a to 150c can be lower than a height H3 of the film layer 840.

Hereinafter, a manufacturing process of the display device 800 according to an embodiment of the present invention will be described with reference to FIGS. 9A to 9D.

FIGS. 9A to 9D are views for explaining an embodiment of a manufacturing process of the display device shown in FIG. 8.

Referring to FIG. 9A, a plurality of semiconductor light emitting devices 150a to 150c can be assembled (transferred) on a substrate 810.

As described above, each of the plurality of semiconductor light emitting devices 150a to 150c can be transferred onto the substrate 810 by various transfer techniques such as pick and place, stamp transfer, roll transfer, fluidic assembly, electromagnetic field and laser transfer. As each of the semiconductor light emitting devices 150a to 150c is transferred onto the substrate 810, the semiconductor light emitting device assemblies 820 can be formed. The semiconductor light emitting device assemblies 820 may constitute one pixel of the display device 800.

Referring to FIG. 9B, after the plurality of semiconductor light emitting devices 150a to 150c are assembled, an encapsulation layer 830 can be formed on the substrate 810.

Specifically, the encapsulation layer 830 can be formed by coating a light-transmitting encapsulant such as silicon or epoxy on the substrate 810 at a predetermined height. Since the encapsulation layer 830 is not formed by molding or the like, the surface of the encapsulation layer 830 may not form a flat surface.

Meanwhile, the overall height of the encapsulation layer 830 formed in FIG. 9B can be higher than the height H2 of the encapsulation layer 830 described above in FIG. 8, and a height deviation may exist for each area.

Referring to FIG. 9C, of the encapsulation layers 830 formed on the substrate 810, the encapsulation layer exceeding a preset height from the upper surface of the substrate 810 can be removed.

For example, in order to remove the encapsulation layer exceeding the preset height, a lapping process can be performed on the encapsulation layer 830. The lapping process can be performed by applying abrasive particles (such as fine diamond) on a metal plate, flipping the encapsulation layer 830 so that it comes into contact with the abrasive particles, and grinding the encapsulation layer 830.

The lapping process can be performed until the height of the encapsulation layer 830 corresponds to the height H2 described in FIG. 8. As the lapping process is performed, a height deviation for each area of the encapsulation layer 830 is removed, so the surface of the encapsulation layer 830 can be generally parallel to the upper surface of the substrate 810.

According to an embodiment, a polishing pattern according to the lapping process can be formed on the surface of the encapsulation layer 830. For example, when the display device 800 is rotated during the lapping process, a pattern including a plurality of curves can be formed on the surface of the encapsulation layer 830.

As the lapping process is performed, the thickness of the encapsulation layer 830 is reduced, so a slimmer display device 800 can be implemented. In addition, as will be described later with reference to FIG. 12, the total reflection phenomenon in the edge area of the display device 800 is prevented, so deterioration of image quality can also be minimized.

Referring to FIG. 9D, a film layer 840 can be formed on the encapsulation layer 830 after the lapping process is performed. For example, the OCA is formed on the lower portion of the film layer 840, so the film layer 840 can be attached to the upper portion of the encapsulation layer 830.

According to an embodiment, the film layer 840 can be implemented as a low-reflection film (eg, a black coating film, etc.) having a lower transmittance than a polarizing film, thereby reducing the thickness compared to the related art.

That is, the display device 800 according to an embodiment of the present invention may pre-form the encapsulation layer 830 by applying an encapsulant, unlike the conventional molding process. Accordingly, in the present invention, the overall height H1 of the coating layers 830 and 840 can be reduced by reducing the height H2 of the encapsulation layer 830 according to the above-described lapping process before the formation of the film layer 840. As the height H1 of the coating layers 830 and 840 is reduced, the total reflection phenomenon in the edge area of the display device 800 can be minimized or eliminated, so a phenomenon in which light having a characteristic different from that of the peripheral area is output from the edge area can be minimized.

Also, according to an embodiment of the present invention, when a defect (scratch, damage, etc.) occurs during the formation of the encapsulation layer 830, since rework of the encapsulation layer 830 is possible after removing the film layer 840, it is possible to prevent cost and time loss due to disposal when defective. This will be described with reference to FIGS. 10A to 10D.

FIGS. 10A to 10D are views for explaining an embodiment of a process of re-forming a coating layer of the display device shown in FIG. 8.

Referring to FIG. 10A, in some cases, a defect occurring on the surface of the encapsulation layer 830 of the display device 800 can be confirmed. For example, the defect occurs when a scratch or damaged area larger than the reference size occurs on the surface of the encapsulation layer 830 during the lapping process, this may mean that the encapsulation layer 830 is not normally formed, such as when a foreign material exists on the surface of the encapsulation layer 830.

Upon confirmation of the defect, the film layer 840 formed on the encapsulation layer 830 can be removed. Since the film layer 840 is attached to the upper portion of the encapsulation layer 830 and is not coupled to the encapsulation layer 830 by molding or the like, the film layer 840 can be easily removed from the encapsulation layer 830 by various known physical/chemical methods.

Referring to FIG. 10B, after the film layer 840 is removed, the encapsulant 830a can be re-applied on the encapsulation layer 830. According to the embodiment, a portion of the encapsulant 830a re-applied on the upper portion of the encapsulation layer 830 may flow into a scratch or damaged area generated on the surface of the pre-formed encapsulation layer 830 to fill a space corresponding to the scratch or damaged area. The scratch or damaged area can be removed according to the inflow of the encapsulant.

Referring to FIG. 10C, a lapping process can be performed on the re-applied encapsulant 830a and the encapsulation layer 830. As the lapping process is re-performed, at least a portion of the re-applied encapsulant 830a and a portion of the encapsulation layer 830 can be removed. During the lapping process, scratches or damaged areas existing in the encapsulation layer 830 can be removed. As the lapping process is re-performed, rework of the encapsulation layer 831 can be completed.

Referring to FIG. 10D, after the rework of the encapsulation layer 831 is completed, the film layer 840 is attached to the upper surface of the encapsulation layer 831, so the display device 800 can be manufactured again.

That is, according to the embodiment shown in FIGS. 10A to 10D, when the encapsulation layer 830 is not normally formed during manufacturing of the display device 800, rework can be performed on the encapsulation layer 830 after the film layer 840 is removed. Accordingly, since the display device 800 may not be discarded when a defect occurs in the encapsulation layer, the manufacturing yield is maximized and manufacturing cost can be reduced.

FIG. 11 is an exemplary view for explaining the relationship between the distance between the semiconductor light emitting device and the edge area of the display device and the thickness of the coating layer. FIG. 12 is an exemplary view illustrating a state in which light is output from an edge area of the display device according to the embodiment of FIG. 8.

Referring to FIGS. 11 to 12, as described above in FIG. 7, the maximum height of the coating layers 830 and 840 for preventing the occurrence of total reflection in the edge area of the display device 800 may vary depending on a distance between the semiconductor light emitting device 150*c* closest to the edge area and a side surface of the coating layer (encapsulation layer 830).

Specifically, the maximum height of the coating layers 830 and 840 for preventing the occurrence of total reflection may decrease as the distance between the semiconductor light emitting device 150*c* and the side surface of the coating layer increases.

According to an embodiment, when the semiconductor light emitting device 150*c* is disposed adjacent to the vertex area of the substrate 810 as shown in FIG. 11, the semiconductor light emitting device 150*c* can be spaced apart from one side of the encapsulation layer 830 by a first distance D1 and can be spaced apart from the other side by a second distance D2. In this case, in order to prevent the occurrence of total reflection, the height of the coating layers 830 and 840 can be determined based on the shorter distance D1 of the first distance D1 and the second distance D2.

If the height of the coating layers 830 and 840 can be sufficiently reduced, the distance between the semiconductor light emitting device 150*c* and the side surface of the coating layer may not be considered. However, in terms of the properties of the materials constituting the coating layers 830 and 840, the process side, and/or the protection side of the semiconductor light emitting devices 150*a* to 150*c*, the coating layers 830 and 840 can be higher than a predetermined minimum height.

Accordingly, as the distance between the semiconductor light emitting device 150*c* and the side surface of the coating layer is increased to a predetermined distance or more, the coating layers 830 and 840 can be more easily formed. However, since the size of the bezel area increases when the distance between the semiconductor light emitting device 150*c* and the side surface of the coating layer is excessively increased, when a single image is provided in a multi-screen display device, there is a problem in that an unnatural image is provided by the bezel area.

Meanwhile, the distance between the semiconductor light emitting device 150*c* and the side surface of the coating layer can be related to the distance PP between the semiconductor light emitting devices 150*a* to 150*c* constituting one pixel. For example, when the size and resolution of the display device 800 are the same, the center position of each pixel can be fixed. In this case, as the distance PP between the semiconductor light emitting devices 150*a* to 150*c* decreases, the arrangement position of the semiconductor light emitting device 150*c* adjacent to the side surface of the coating layer can be closer to the center position of the corresponding pixel. Accordingly, since the distance D1 between the semiconductor light emitting device 150*c* and the side surface of the coating layer increases, the maximum height of the coating layer for preventing total reflection may increase.

Accordingly, the display device 800 according to an embodiment of the present invention increases the distance D1 between the semiconductor light emitting device 150*c* and the side surface of the coating layer by decreasing the distance PP between the semiconductor light emitting devices 150*a* to 150*c*, it is possible to more easily implement the coating layers 830 and 840 having a height that prevents the occurrence of total reflection.

As shown in FIG. 12, when the height H1 of the coating layers 830*a* and 840*a* included in the first display device 800*a* is less than the maximum height of the coating layer for preventing total reflection, it can be seen that the light emitted to the side surfaces of the coating layers 830*a* and 840*a* is transmitted through the coating layers 830*b* and 840*b* of the second display device 800*b* without being totally reflected. Accordingly, since the occurrence of light increase or extinction due to total reflection in the edge area of the display devices 800*a* and 800*b* is prevented, it is possible to prevent the light identified in the edge area from having different characteristics (color, brightness, etc.) from the light identified in the peripheral area.

Accordingly, when one image is provided in a multi-screen display device including a plurality of tiled display devices, it is possible to prevent the occurrence of heterogeneity or quality deterioration of the image due to the difference in optical characteristics in the edge area.

The above description is merely illustrative of the technical idea of the present invention, various modifications and variations will be possible without departing from the essential characteristics of the present invention by those skilled in the art to which the present invention pertains.

Therefore, the embodiments disclosed in the present invention are not intended to limit the technical spirit of the present invention, but to explain, and the scope of the technical spirit of the present invention is not limited by these embodiments.

The protection scope of the present invention should be interpreted by the following claims, and all technical ideas within the scope equivalent thereto should be construed as being included in the scope of the present invention.

What is claimed is:

1. A method of manufacturing a display device, comprising:

transferring a plurality of semiconductor light emitting devices to an upper surface of a substrate;

forming an encapsulation layer covering the upper surface of the substrate and the plurality of semiconductor light emitting devices;

removing a portion of the encapsulation layer, from among a plurality of encapsulation layers, exceeding a preset height from the upper surface of the substrate;

forming a film layer on an upper surface of the encapsulation layer;

removing the film layer from the upper surface of the encapsulation layer;

applying a light-transmitting encapsulant on the upper surface of the encapsulation layer, resulting in a reworked encapsulation layer;

re-forming the reworked encapsulation layer by removing an encapsulation layer or a light-transmitting encapsulant exceeding a preset height from the upper surface of the substrate from among the encapsulation layer and the applied light-transmitting encapsulant, resulting in a re-formed encapsulation layer; and forming a second film layer on an upper surface of the re-formed encapsulation layer, wherein the film layer is disposed on the upper surface of the encapsulation layer to have a separation distance from the plurality of semiconductor light emitting devices, wherein the film layer comprises a light-transmitting adhesive film directly attached on the upper surface of the encapsulation layer, and wherein the encapsulation layer comprises a light-transmitting silicone or epoxy and does not comprise an adhesive film.

2. The method of manufacturing a display device according to claim 1, wherein the removing the portion of the encapsulation layer exceeding the preset height comprises:

performing a lapping process on the encapsulation layer exceeding the preset height, wherein a polishing pattern is on the upper surface of the encapsulation layer.

3. The method of manufacturing a display device according to claim 1, wherein the preset height is a height at which a total reflection of light irradiated to side surfaces of the encapsulation layer and the film layer from the semiconductor light emitting device closest to an edge region of the substrate among the plurality of semiconductor light emitting devices is avoided.

4. The method of manufacturing a display device according to claim 1, wherein a height from respective upper surfaces of the plurality of semiconductor light emitting devices to the upper surface of the encapsulation layer is less than or equal to a height from the upper surface of the encapsulation layer to an upper surface of the film layer.

5. The method of manufacturing a display device according to claim 1, wherein a height from the upper surface of the substrate to the upper surface of the encapsulation layer is greater than or equal to a height from the upper surface of the encapsulation layer to an upper surface of the film layer.

6. The method of manufacturing a display device according to claim 1, wherein the forming of the encapsulation layer comprises applying a light-transmitting encapsulant made of silicone or epoxy material on the substrate.

* * * * *